(12) United States Patent
Takada et al.

(10) Patent No.: US 8,493,487 B2
(45) Date of Patent: Jul. 23, 2013

(54) PHOTOELECTRIC CONVERSION APPARATUS AND IMAGING SYSTEM USING FLOATING LIGHT SHIELDING PORTIONS

(75) Inventors: Hideaki Takada, Yokohama (JP); Masanori Ogura, Kawasaki (JP); Hiroki Hiyama, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 493 days.

(21) Appl. No.: 12/547,876

(22) Filed: Aug. 26, 2009

(65) Prior Publication Data

US 2010/0060762 A1    Mar. 11, 2010

(30) Foreign Application Priority Data

Sep. 10, 2008 (JP) ................... 2008-232316

(51) Int. Cl.
*H04N 5/335* (2011.01)
(52) U.S. Cl.
USPC ........................................ 348/308
(58) Field of Classification Search
USPC ............. 348/247, 300, 374, 236, 294, 298, 348/308
See application file for complete search history.

(56) References Cited

U.S. PATENT DOCUMENTS

| | | | |
|---|---|---|---|
| 5,121,225 A | 6/1992 | Murata et al. | 358/471 |
| 5,475,211 A | 12/1995 | Ogura et al. | 250/208.1 |
| 5,847,381 A | 12/1998 | Isogai | 250/208 |
| 6,188,094 B1 | 2/2001 | Kochi et al. | 257/232 |
| 7,110,030 B1 | 9/2006 | Kochi et al. | 348/308 |
| 7,187,052 B2 | 3/2007 | Okita et al. | 257/444 |
| 7,227,208 B2 | 6/2007 | Ogura et al. | 257/292 |
| 7,283,305 B2 | 10/2007 | Okita et al. | 359/619 |
| 7,408,210 B2 | 8/2008 | Ogura et al. | 257/233 |
| 7,417,273 B2* | 8/2008 | Inoue et al. | 257/292 |
| 7,456,880 B2 | 11/2008 | Okita et al. | 348/243 |
| 7,460,162 B2 | 12/2008 | Koizumi et al. | 348/294 |
| 7,514,732 B2 | 4/2009 | Okita et al. | 257/292 |
| 7,538,804 B2 | 5/2009 | Okita et al. | 348/241 |
| 7,557,847 B2 | 7/2009 | Okita et al. | 348/308 |
| 7,605,415 B2 | 10/2009 | Koizumi et al. | 257/291 |
| 8,158,988 B2* | 4/2012 | Gambino et al. | 257/81 |
| 2004/0159861 A1* | 8/2004 | Mori et al. | 257/223 |
| 2005/0174552 A1 | 8/2005 | Takada et al. | 355/53 |
| 2005/0212937 A1* | 9/2005 | Koyama | 348/301 |
| 2005/0237405 A1 | 10/2005 | Ohkawa | 348/208 |
| 2006/0043440 A1 | 3/2006 | Hiyama et al. | 257/291 |
| 2006/0044439 A1 | 3/2006 | Hiyama et al. | 348/308 |
| 2006/0170009 A1* | 8/2006 | Kitano et al. | 257/236 |
| 2007/0205439 A1 | 9/2007 | Okita et al. | 257/228 |
| 2007/0215912 A1 | 9/2007 | Kido et al. | 257/257 |

(Continued)

FOREIGN PATENT DOCUMENTS

CN        1703901 A    11/2005
CN    101170643 A     4/2008

(Continued)

*Primary Examiner* — Timothy J Henn
(74) *Attorney, Agent, or Firm* — Fitzpatrick, Cella, Harper & Scinto

(57) ABSTRACT

In a photoelectric conversion apparatus having a plurality of unit cells, wherein each of the unit cells has a photoelectric conversion element, a transfer transistor and a floating diffusion region, a light shielding portion arranged on an upper portion of the floating diffusion region is included. The respective light shielding portions are separated from one another, and are in a floating state without being electrically connected to the floating diffusion region.

16 Claims, 5 Drawing Sheets

41 light shielding portion
42 light shielding portion
43 light shielding portion

U.S. PATENT DOCUMENTS

| | | | |
|---|---|---|---|
| 2008/0062296 A1 | 3/2008 | Ogura et al. | 348/308 |
| 2008/0100728 A1* | 5/2008 | Nagata | 348/247 |
| 2008/0217618 A1* | 9/2008 | Deane | 257/59 |
| 2008/0284882 A1 | 11/2008 | Mori et al. | 348/294 |
| 2009/0002538 A1 | 1/2009 | Mori et al. | 348/311 |
| 2009/0218479 A1 | 9/2009 | Arishima et al. | 250/226 |
| 2009/0237543 A1 | 9/2009 | Hatano et al. | 348/308 |

FOREIGN PATENT DOCUMENTS

| | | |
|---|---|---|
| JP | 09-260631 A | 10/1997 |
| JP | 2005-051009 A | 2/2004 |
| JP | 2005-317581 A | 11/2005 |
| JP | 2006-303468 A | 11/2006 |
| JP | 2008-109501 A | 5/2008 |

* cited by examiner

1 N-type semiconductor region
2 gate electrode
3 contact
4 N-type semiconductor region
5 wiring
6 light shielding portion
7 wiring
8 demarcated region
9 micro lens
10 element isolation region
11 P-type semiconductor region
12 color filter
13 insulation film
14 insulation film
15 insulation film
20 unit cell
101 incident light
102 reflected light
103 stray light 20 unit cell
21 photoelectric conversion element
22 transfer transistor
23 floating diffusion region
24 reset transistor
25 amplifying transistor
26 selecting transistor
27 output line 30 shared contact
31 wiring
32 gate electrode
33 light shielding portion
34 light shielding portion 41 light shielding portion
42 light shielding portion
43 light shielding portion

PHOTOELECTRIC CONVERSION APPARATUS AND IMAGING SYSTEM USING FLOATING LIGHT SHIELDING PORTIONS

BACKGROUND OF THE INVENTION

1. Field of the Invention

The present invention relates to a photoelectric conversion apparatus and an imaging system including the same.

2. Description of the Related Art

As typical kinds of photoelectric conversion apparatuses used for digital cameras, CCD type and MOS type photoelectric conversion apparatuses are cited. A photoelectric conversion apparatus has a pixel region in which pixels each including one photoelectric conversion element such as a photodiode are arranged. In the photoelectric conversion apparatuses, the number of pixels has been increased, and the countermeasures against leaked light incident in adjacent pixel (cross-talk) which can be caused by the increased number of pixels are studied. For example, against the leaked light incident in adjacent pixel when the light is incident with a large incident angle, shielding the light passing through the upper portion of a floating diffusion region, for example, is conceivable in MOS type photoelectric conversion apparatus.

Japanese Patent Application Laid-Open No. 2005-317581 discloses a construction configured to provide a large width portion in the wiring for driving pixels. By the large width portion, light shielding of the floating diffusion region (hereinafter, described as an FD region) appears to be performed.

However, in the construction of Japanese Patent Application Laid-Open No. 2005-317581, the wiring for driving pixels, namely, the wiring with the fixed potential is arranged on the upper portion of the FD region. Accordingly, the capacity of the FD region increases due to the capacity which occurs between the FD region and the wiring layer having the large width portion.

Here, in order to prevent increase in the capacity of the FD region, a method is conceivable, in which the wiring layer having the large width portion of Japanese Patent Application Laid-Open No. 2005-317581 is not electrically fixed. However, since a metal layer which is not electrically fixed is used, the metal layer may vary by being influenced by electric variation of the FD region, and propagate the electric variation to the other FD regions to cause electric cross-talk.

Thus, it is an object of the present invention to provide a photoelectric conversion apparatus capable of reducing optical cross-talk while suppressing increase in capacity of an FD region and increase in electric cross-talk of the FD region.

SUMMARY OF THE INVENTION

A photoelectric conversion apparatus of the present invention comprises a plurality of unit cells arranged, wherein each of the unit cells includes a photoelectric conversion element, a transfer transistor for transferring an electric charge generated in the photoelectric conversion element, and a floating diffusion region including a semiconductor region into which the electric charge is transferred by the transfer transistor, wherein the unit cell has a light shielding portion above the floating diffusion region, and the light shielding portions of the plurality of unit cells are separated from one another, and are in a floating state without being electrically connected to the floating diffusion region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The accompanying drawings, which are incorporated in and constitute a part of the specification, illustrate embodiments of the invention and, together with the description, serve to explain the principles of the invention.

In a photoelectric conversion apparatus of the present invention, a light shielding portion which is not electrically fixed is independently arranged on an upper portion of each FD region. By such a construction, optical cross-talk can be suppressed by shielding leaked light incident in an adjacent pixel across the upper portion of the FD region while increase in capacity of the FD region is suppressed to a minimum. By such a construction, as compared with the case where a light shielding portion which is electrically fixed (having a fixed potential) is included, the capacity of the FD region can be decreased. Further, as compared with the case where a light shielding portion which is not electrically fixed is arranged over a plurality of unit cells, electric cross-talk can be reduced.

Hereinafter, a minimum unit including one photoelectric conversion element will be described as a pixel, and a repetition unit will be called a unit cell. Further, the state in which a certain node is not electrically fixed is expressed as floating, or an electrically floating state.

Embodiments of the present invention will be described in detail by using the drawings.

First Embodiment

A photoelectric conversion apparatus of the present embodiment will be described by using FIGS. 1A, 1B and 2. First, one example of a pixel circuit of the photoelectric conversion apparatus will be described by using FIG. 2.

Figure 2:
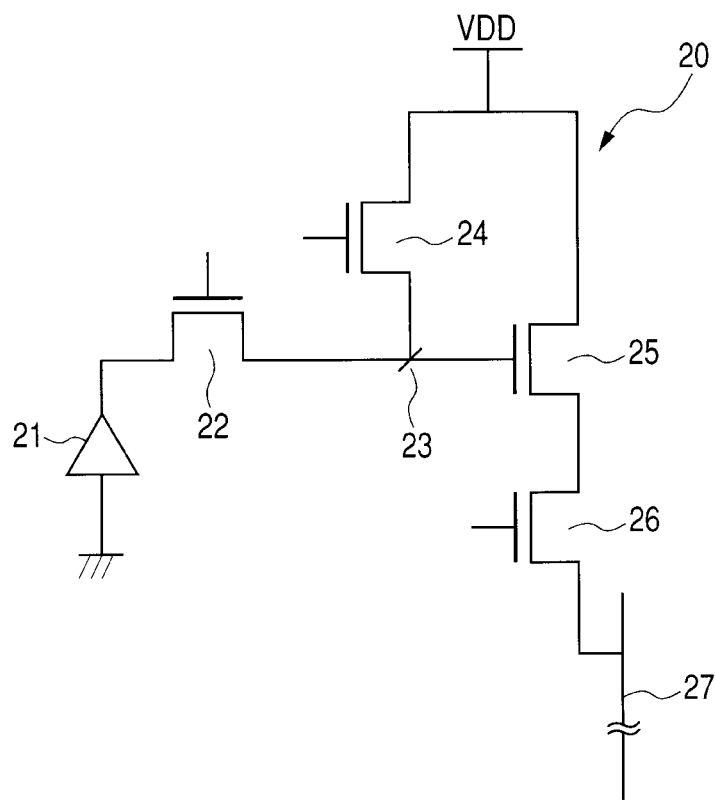
FIG. 2 is one example of a pixel circuit of the photoelectric conversion apparatus.

In FIG. 2, a unit cell 20 has one photoelectric conversion element 21 such as a photodiode, a transfer transistor 22, a floating diffusion region (FD region) 23, a reset transistor 24, an amplifying transistor 25, a row selecting transistor 26. The electric charge generated in the photoelectric conversion element 21 is transferred to the FD region 23 by the transfer transistor 22. The transfer transistor 22 also can be described as a switch which electrically connects the photoelectric conversion element 21 and the FD region 23. The FD region 23 and a gate electrode of the amplifying transistor 25 have the same node. When the row selecting transistor 26 is turned on, a signal based on the potential of the FD region 23 is output to an output line 27 through the amplifying transistor 25. In this case, the FD region is configured by a semiconductor region, the gate electrode of the amplifying transistor and a conductor which connects them. In the photoelectric conversion apparatus, a plurality of such unit cells 20 is arranged.

In the present embodiment, the unit cell 20 includes one photoelectric conversion element 21 and one FD region 23, but the unit cell 20 may include two photoelectric conversion elements. More specifically, two pixels may share the amplifying transistor 25, the reset transistor 24 and the selecting transistor 26. Further, two pixels may share the semiconductor region of the FD region. Further, the construction may be properly changed to a construction without using the selecting transistor 26. It should be noted that a pixel includes one photoelectric conversion element.

Next, the present embodiment will be described in detail by using FIGS. 1A and 1B. FIG. 1A is a schematic plane view of main parts including the photoelectric conversion elements 21 in FIG. 2 of two pixels. FIG. 1B is a schematic sectional view taken along the line 1B-1B in FIG. 1A. In each of FIGS. 1A and 1B, the amplifying transistor, the reset transistor and the like in FIG. 2 are omitted.

Each of the constructions of FIGS. 1A and 1B will be described. A P-type semiconductor region 11 is included. The P-type semiconductor region 11 may be a semiconductor substrate, or may be an N-type. An N-type semiconductor region 1 configures a photodiode. A gate electrode 2 of the transfer transistor reads the electric charges accumulated in the N-type semiconductor region 1. The electric charges are transferred to an N-type semiconductor region 4, and the N-type semiconductor region 4 configures the FD region. A wiring 5 connects the semiconductor region 4 and an input node of the amplifying transistor (not illustrated), and a contact 3 connects the semiconductor region 4 and the wiring 5. In this case, the semiconductor region 4, the wiring 5 and the contact 3 have the same node. A micro lens 9 is arranged correspondingly to the photoelectric conversion element. A color filter 12 is included. The color filter 12 is arranged corresponding to the photoelectric conversion element, and has a Bayer array. To an element isolation region 10, a construction such as LOCOS and STI is applied. Though not clearly illustrated in FIG. 1B, insulation films 13, 14 and 15 are arranged around the wirings and on the lower portion of the color filter. Small constructions such as a protection film and a flattened film are omitted. Further, the amplifying transistor and the reset transistor are assumed to be in a region 8 and are omitted. The side at the micro lens 9 of the N-type semiconductor region 1 is used as a light receiving surface of the photoelectric conversion element.

Figure 1A:
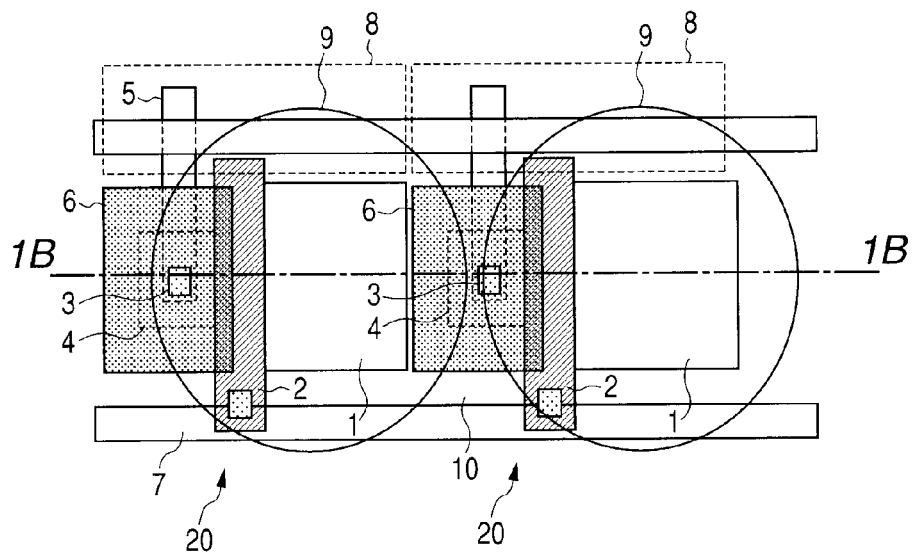
FIG. 1A is a schematic plane view of a photoelectric conversion apparatus describing a first embodiment.
Figure 1B:
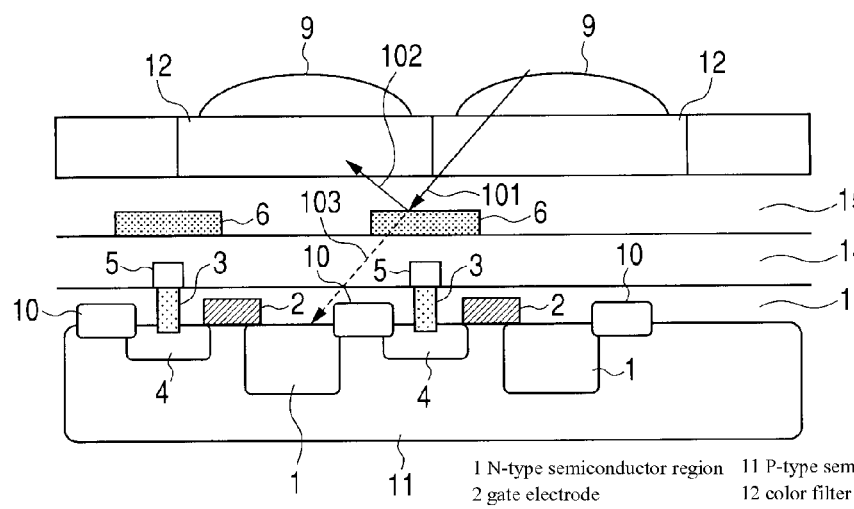
FIG. 1B is a schematic sectional view of the photoelectric conversion apparatus describing the first embodiment.

In FIGS. 1A and 1B, a light shielding portion 6 is arranged on an upper portion of the semiconductor region 4. The light shielding portions 6 of a plurality of unit cells 20 are provided independently, and the insulation film 15 is arranged between the light shielding portion 6 and the light shielding portion 6 of another unit cell 20. Specifically, a plurality of light shielding portions 6 is electrically separated from one another. The light shielding portion 6 is not electrically connected to the FD region. Specifically, the light shielding portion 6 is in a floating state. Further, in the present embodiment, the light shielding portion 6 is arranged in the unit cell 20, and the light shielding portion 6 does not extend onto the elements which the other unit cells have. The light shielding portion 6 can be formed from the same material as that of the wirings, for example, a metal such as aluminum and copper. A wiring 7 is formed on the same layer as the light shielding portion 6, and is, for example, a drive wiring for the transistor.

By such a construction, optical cross-talk can be reduced while increase in the capacity of the FD region formed from the semiconductor region 4, and increase in electric cross-talk of the FD region are suppressed. The effect will be described in detail hereinafter.

First, the case where an incident light as shown by 101 in FIG. 1B is incident in the photoelectric conversion element is considered. Unless the light shielding portion 6 is provided, the incident light 101 is incident in the adjacent N-type semiconductor region 1 in which the incident light 101 should not essentially be incident, namely, the photoelectric conversion element, as a light 103. Subsequently, the light 103 which becomes a stray light is output as the signal of the adjacent pixel, and color mixture in which the color of the image to be formed becomes a different color from an actual image occurs. Meanwhile, when the light shielding portion 6 is provided on the upper portion of the FD region, the incident light 101 is reflected by the light shielding portion 6 as a light 102, and incidence of the light in the adjacent photoelectric conversion element can be suppressed. When a light incident at a large incident angle is incident on the light receiving surface, the light is easily incident on the upper portion of the FD region since the FD region is provided adjacently to the photoelectric conversion element. Therefore, shielding the upper portion of the FD region is effective against the incident light at a large incident angle. Therefore, by arranging the light shielding portion 6 on the upper portion of the FD region, optical cross-talk can be suppressed. Especially, the light shielding portion 6 can be arranged on a position where it is superimposed in the horizontal projected plane on the directly upper portion of the FD region. By such a construction, the light shielding portion 6 can shield the FD region.

Further, the light shielding portion 6 is not electrically connected to the FD region. As a result, the capacity of the FD region can be prevented from increasing. Further, by bringing the light shielding portion 6 into a floating state, the coupling capacity with the FD region can be made small as compared with the case where the light shielding portion 6 is at a fixed potential. By suppressing the increase in the capacity of the FD region, the SN ratio of the output signal of the photoelectric conversion apparatus can be suppressed.

Further, as the result that the light shielding portion 6 is not arranged up to the upper portion of the semiconductor region 4 adjacent to a certain semiconductor region 4 over which the light shielding portion 6 is arranged, electric cross-talk can be reduced. This is because when the light shielding portion 6 is coupled with a plurality of FD regions, the potentials of the FD regions vary when electric charges are transferred to them, and therefore, the variations of the potentials of the FD regions with different electric charge amounts and timings are transmitted through the light shielding portion 6. The common light shielding portion 6 is not arranged on a certain FD region and the upper portion of the FD region differing from it, whereby the electric cross-talk can be reduced. Further, the light shielding portion 6 does not extend up to the other unit cells 20. By the construction, increase in the capacity can be suppressed, and influence of the transistors and the like of the other unit cells 20 can be reduced.

Therefore, by the construction of the present embodiment, optical cross-talk can be reduced while increase in the capacity of the FD region and electric cross-talk are suppressed. Here, when the capacity of the FD region is large, the SN ratio (signal noise ratio) reduces. Therefore, by the construction of the invention of the present application, the SN ratio can be increased as compared with the case where the light shielding layer at a fixed potential is included.

Other than the construction provided with the color filters 12 of colors which differ between the adjacent color filters, a construction provided with no color filter 12, and a construction provided with the color filters 12 of the same color may be adopted. However, in the construction of the color filter 12 as in the present embodiment, for example, the photoelectric conversion element of a green color sometimes detects the light which should configure a red color, and therefore, the effect of the light shielding portion 6 can be especially obtained.

Further, when the micro lens 9 is included as in the present embodiment, the light shielding portion 6 can be arranged correspondingly to the boundary of the adjacent micro lens 9. This is because the light incident in the boundary of the micro lens 9 is prevented from being incident in the FD region, and the optical cross-talk to the adjacent pixel can be reduced.

Second Embodiment

Figure 3A:
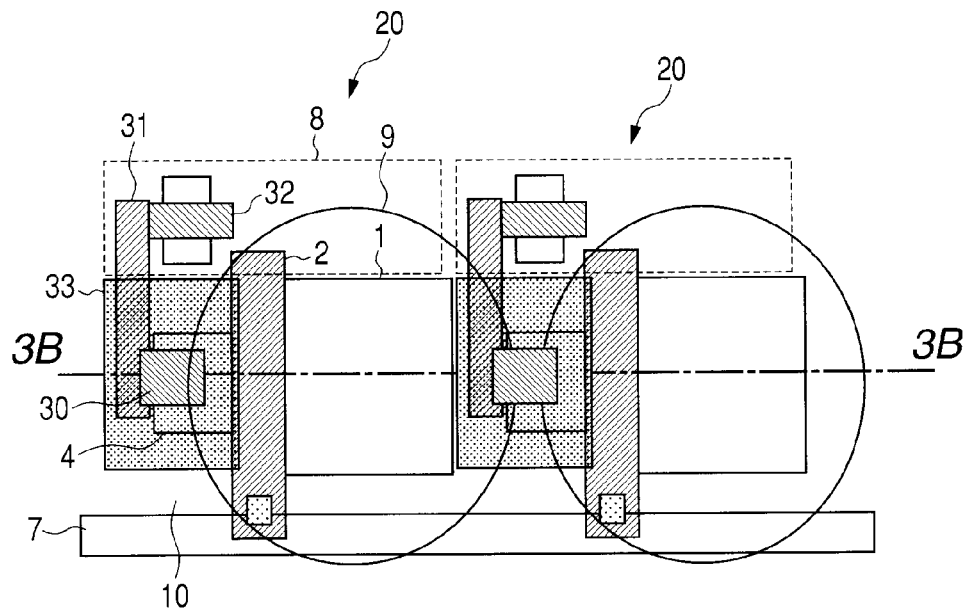
FIG. 3A is a schematic plane view of a photoelectric conversion apparatus describing a second embodiment.
Figure 3B:
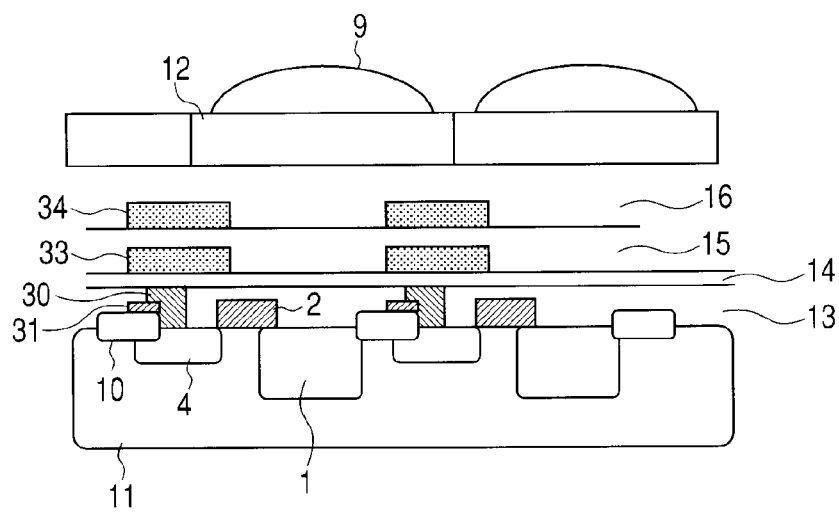
FIG. 3B is a schematic sectional view of a photoelectric conversion apparatus describing the second embodiment.

The present embodiment will be described by using FIGS. 3A and 3B. FIG. 3A is a schematic plane view of two pixels of the photoelectric conversion apparatus, and FIG. 3B is a schematic sectional view corresponding to the line 3B-3B of FIG. 3A. FIG. 3A corresponds to FIG. 1A, whereas FIG. 3B corresponds to FIG. 1B. In FIGS. 3A and 3B, the same constructions as in FIGS. 1A and 1B are assigned with the same reference numerals, and description of them will be omitted. In FIGS. 3A and 3B, the constructions other than those of the target portions are omitted as in FIGS. 1A and 1B.

The present embodiment differs from the first embodiment in that two layers of light shielding portions are arranged on the upper portion of the semiconductor region 4. Further, the present embodiment differs from the first embodiment in that a shared contact is used for reading a signal from the semiconductor region 4. More specifically, the present embodiment has a light shielding portion 33 which is arranged at the same height as a first wiring layer and a light shielding portion 34 which is arranged at the same height as a second wiring layer, on the upper portion of the semiconductor region 4. The present embodiment also has a shared contact 30 for reading a signal to a wiring 31 formed from polysilicon from the semiconductor region 4. The wiring 31 is formed to connect to a gate electrode 32 of the amplifying transistor. In the present embodiment, the semiconductor region 4, the shared contact 30 and the gate electrode 32 of the amplifying transistor have the same node, and configure the FD region.

The light which is incident inclined can be easily shielded by providing two layers of the light shielding portions as in the present embodiment, and therefore, optical cross-talk can be reduced. Further, by adopting the shared contact instead of the contact as a leading portion of the signal from the semiconductor region 4, the light shielding portion at the same height as the first wiring layer can be provided. As a result that the light shielding portion is arranged at the same height as the first wiring layer which is the closest to the FD region, near the semiconductor region 11, the light shielding performance also can be enhanced against the light incident at an angle. Further, by providing the light shielding portion on the wiring layer which is the closest to the FD region, the capacity can be positively formed between the light shielding portion and the FD region. Therefore, coupling with the other wirings with fixed potentials can be suppressed. As a result, increase in the capacity of the FD region and influence of electric cross-talk can be reduced.

Further, the light shielding portion 33 can be formed by the same process as the wiring of the first wiring layer, and the light shielding portion 34 can be formed by the same process as the wiring of the second wiring layer. Specifically, the light shielding portion 33 and the wiring of the first wiring layer may be formed from the same material, and the light shielding portion 34 and the wiring of the second wiring layer may be formed from the same material. Further, a light shielding portion may be provided at the height of a third wiring layer, and the method for providing a plurality of light shielding portions is optional. The first wiring layer, the second wiring layer and the third wiring layer are arranged in this order from the semiconductor region 11 via the insulation films 15 and 16.

Third Embodiment

Figure 4:
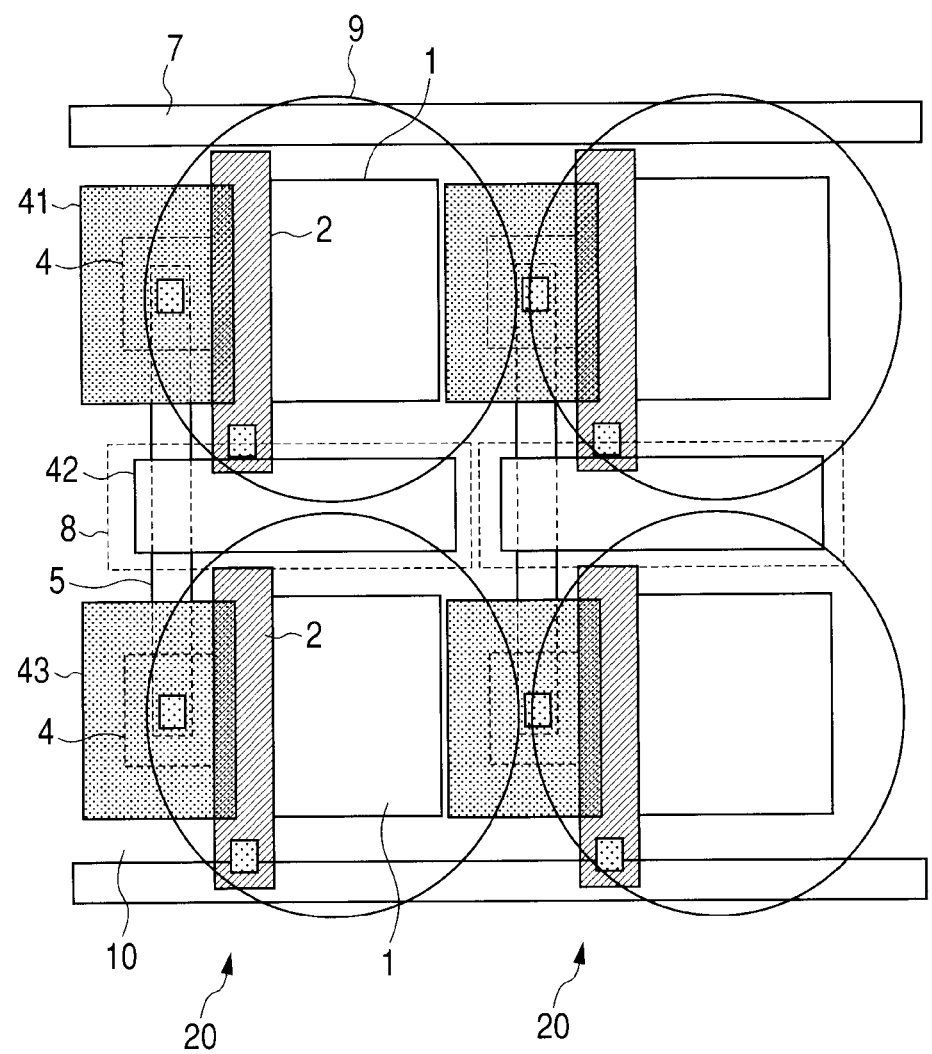
FIG. 4 is a schematic plane view of a photoelectric conversion apparatus describing a third embodiment.

The present embodiment will be described by using FIG. 4. FIG. 4 is a schematic plane view of four pixels of the photoelectric conversion apparatus, and corresponds to FIG. 1A. In FIG. 4, the same constructions as those in FIG. 1A are assigned with the same reference numerals, and description of them will be omitted. Further, in FIG. 4, the constructions other than those of the target portions are omitted as in FIG. 1A.

The present embodiment differs from the first embodiment in that one amplifying transistor is shared by two photoelectric conversion elements. Specifically, in the unit cell 20 shown in FIG. 2, the photoelectric conversion element 21 and the transfer transistor 22 are added. In the present embodiment, the two semiconductor regions 4 are connected by the wiring 5 to have the same node. More specifically, the two semiconductor regions 4, the wiring 5 for connecting them and the gate electrode of the amplifying transistor have the same node, and configure the FD region. A plurality of light shielding portions 41, 42 and 43 is arranged on the upper portion of the FD region. Further, light shielding portions 41, 42 and 43 do not extend onto the upper portion of the elements which the other unit cells 20 have.

According to such formation, the number of reading transistors for one photoelectric conversion element can be reduced. Therefore, the drive wirings for the transistors can be reduced, the degree of freedom of wiring layout is increased, and the opening ratio of the photoelectric conversion element can be increased. Further, a plurality of light shielding portions may be provided for one FD region, like the light shielding portions 41, 42 and 43. By this construction, occurrence of electric cross-talk can be suppressed more, and optical cross-talk can be reduced. Only the light shielding portion 42 which is arranged on the upper portion of the wiring 5 instead of the semiconductor region 4 may be provided, and even when each of the light shielding portions is constructed by one member, the invention of the present application is effective.

Further, in the present embodiment, one semiconductor region 4 is provided for each photoelectric conversion element, but one semiconductor region 4 may be provided for a plurality of photoelectric conversion elements.

(Application to Imaging System)

In the present embodiment, application of the photoelectric conversion apparatuses, which are described in the first embodiment and the third embodiment, to imaging systems will be described by using FIG. 5. The imaging systems include a digital still camera, a digital video camera and a digital camera for a cellular phone.

Figure 5:
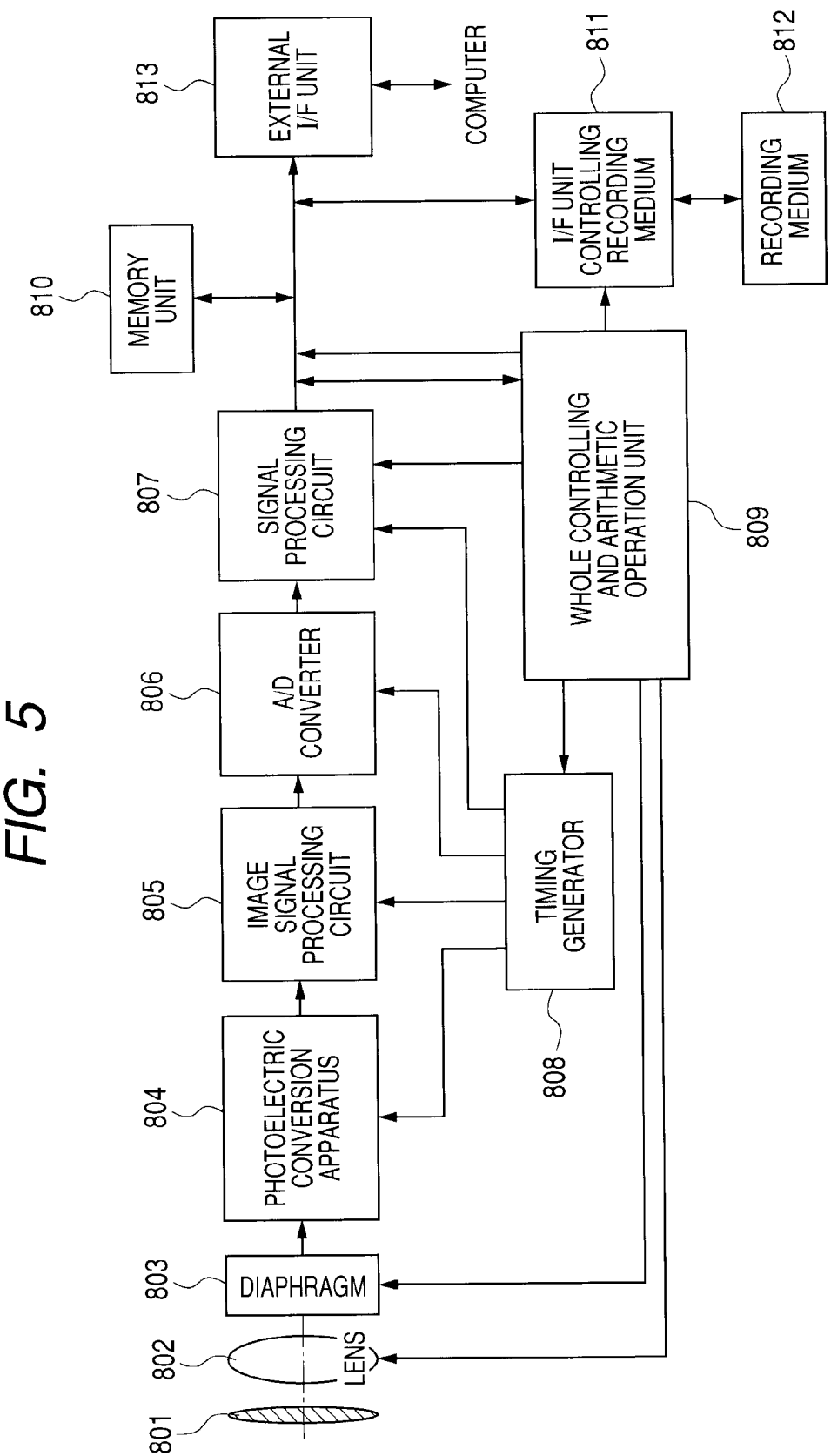
FIG. 5 is a block diagram describing an imaging system.

FIG. 5 is a block diagram of a digital still camera. An optical image of a subject is formed on an imaging surface of a photoelectric conversion apparatus 804 by an optical system including a lens 802. A barrier 801 which performs both a protect function and a main switch function for the lens 802 can be provided outside the lens 802. A diaphragm 803 for adjusting the quantity of a light emitted from the lens 802 is provided at the lens 802. Image signals output over a plurality of channels from the photoelectric conversion apparatus 804 are subjected to processing of various corrections and clamp by an image signal processing circuit 805. The image signals output over a plurality of channels from the image signal processing circuit 805 are subjected to analog-digital conversion in an A/D converter 806. The image data output from the A/D converter 806 is subjected to various corrections and data compression by a signal processing unit (image processing unit) 807. The photoelectric conversion apparatus 804, the image signal processing circuit 805, the A/D converter 806 and the signal processing unit 807 operate according to a timing signal generated by a timing generator 808. Each block is controlled by a whole controlling and arithmetic operation unit 809. Besides, a memory unit 810 for temporarily storing the image data and an interface unit controlling recording medium 811 for recording or reading an image to and from a recording medium are included. A recording medium 812 is configured by including a semiconductor memory, and is attachable and detachable. Further, an external interface (I/F) unit 813 for communicating with an external computer may be included. Here, the components 805 to 808 may be formed on the same chip as in the photoelectric conversion apparatus 804.

Next, an operation of FIG. 5 will be described. In response to opening of the barrier 801, a main power supply, a power supply for a control system, and a power supply for an imaging system circuit such as the A/D converter 806 are sequentially turned on. Thereafter, in order to control the exposure amount, the whole controlling and arithmetic operation unit 809 causes the diaphragm 803 to open. The signal output from the photoelectric conversion apparatus 804 passes through the image signal processing circuit 805 and is provided to the A/D converter 806. The A/D converter 806 performs A/D conversion of the signal and outputs the signal to the signal processing unit 807. The signal processing unit 807 processes the data, and provides the data to the whole controlling and arithmetic operation unit 809, which performs arithmetic operation for determining the exposure amount. The whole controlling and arithmetic operation unit 809 controls the diaphragm based on the determined exposure amount. Next, the whole controlling and arithmetic operation unit 809 takes out a high frequency component from the signal which is output from the photoelectric conversion apparatus 804 and processed in the signal processing unit 807, and arithmetically operates a distance to the subject based on the high frequency component. Thereafter, the whole controlling and arithmetic operation unit 809 drives the lens 802 and determines whether it is focusing or not. When determining that it is not focusing, the whole controlling and arithmetic operation unit 809 drives the lens 802 again, and arithmetically operates the distance. After focusing is confirmed, actual exposure is started. When the exposure is finished, the image signal output from the photoelectric conversion apparatus 804 is corrected in the image signal processing circuit 805, is subjected to A/D conversion in the A/D converter 806, and is processed in the signal processing unit 807. The image data processed in the signal processing unit 807 is accumulated in the memory unit 810 by the whole controlling and arithmetic operation unit 809. Thereafter, the image data accumulated in the memory unit 810 is recorded in the recording medium 812 via the recording medium control I/F unit by control of the whole controlling and arithmetic operation unit 809. Further, the image data is provided to a computer through the external I/F unit 813 and processed.

In this manner, the photoelectric conversion apparatus of the present invention is applied to the imaging system. Among the imaging systems, a photoelectric conversion apparatus for a single lens reflex camera is sometimes used especially with the value of the diaphragm (F value) of F=1.2, unlike a compact camera and a video camera. Among the lights incident in this case, more lights are incident in the direction at a significantly large angle with respect to the light receiving surface of the photoelectric conversion element of the photoelectric conversion apparatus. In concrete, many light beams are incident on the light receiving surface. Each of them has an angle of substantially 70 degrees or more from the perpendicular direction with respect to the light receiving surface of the photoelectric conversion element. Therefore, it is especially effective to apply the photoelectric conversion apparatus of the present invention in a single lens reflex camera.

The embodiments which are described above are only examples of the present invention, and the conductive type of the semiconductor region and the circuit configurations are not limited to these embodiments. For example, the present invention is effective even when the amplifying transistor is shared by four photoelectric conversion elements. The conductive type may be inverted. Further, the constructions of the respective embodiments, in concrete, the pixel constructions and the constructions of the wirings can be properly combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-232316, filed Sep. 10, 2008, which is hereby incorporated by reference herein in its entirety.

What is claimed is:

1. A photoelectric conversion apparatus comprising:
a plurality of unit cells arranged, wherein each of the unit cells includes
a photoelectric conversion element,
a transfer transistor for transferring an electric charge generated in the photoelectric conversion element, and
a floating diffusion region including a semiconductor region into which the electric charge is transferred by the transfer transistor, wherein
each of the unit cells has a light shielding portion arranged above the floating diffusion region, the light shielding portion being formed of a conductive material,
each of the light shielding portions of the plurality of unit cells is separated from one another,
each of the light shielding portions is in an electrically floating state, and
each of the light shielding portions is not electrically connected to the floating diffusion regions.

2. The photoelectric conversion apparatus according to claim 1, further comprising
a plurality of wirings, wherein
the light shielding portions are formed of the same material as that of the plurality of wirings.

3. The photoelectric conversion apparatus according to claim 1, wherein
each of the unit cells includes a plurality of the photoelectric conversion elements.

4. The photoelectric conversion apparatus according to claim 1, wherein
the floating diffusion region of each of the unit cells includes a plurality of the semiconductor regions mutually connected electrically.

5. The photoelectric conversion apparatus according to claim 1, wherein
each of the unit cells includes an amplifying transistor, and the amplifying transistor has a gate electrode electrically connected to the semiconductor region of the corresponding floating diffusion region.

6. The photoelectric conversion apparatus according to claim 5, wherein
the floating diffusion region includes the gate electrode of the corresponding amplifying transistor.

7. The photoelectric conversion apparatus according to claim 1, further comprising
color filters each arranged correspondingly to one of the plurality of the photoelectric conversion elements.

8. The photoelectric conversion apparatus according to claim 1, wherein
a plurality of the light shielding portions are arranged correspondingly to one of the floating diffusion regions.

9. An imaging system comprising:
a photoelectric conversion apparatus according to claim 1; and
a signal processing circuit for processing a signal output from the photoelectric conversion apparatus.

10. A photoelectric conversion apparatus comprising:
a plurality of unit cells arranged, wherein each of the unit cells includes
a plurality of photoelectric conversion elements,
a plurality of transfer transistors, each arranged correspondingly to one of the plurality of photoelectric conversion elements, transferring electric charge generated in the plurality of photoelectric conversion elements,
a floating diffusion region, the floating diffusion region including a plurality of semiconductor regions, into each of which the electric charge is transferred by a corresponding one of the transfer transistors, and
an amplifying transistor having a gate electrode electrically connected to the plurality of semiconductor regions;
color filters each arranged correspondingly to one of the plurality of the photoelectric conversion elements; and
a plurality of wirings, wherein
each of the unit cells has a light shielding portion arranged above the floating diffusion region, the light shielding portion being formed of a conductive material,
each of the light shielding portions of the plurality of unit cells is separated from one another and is formed of the same material as that of the plurality of wirings,
each of the light shielding portions is in an electrically floating state, and
each of the light shielding portions is not electrically connected to the floating diffusion regions.

11. An imaging system comprising:
a photoelectric conversion apparatus according to claim 10; and
a signal processing circuit for processing a signal output from the photoelectric conversion apparatus.

12. The photoelectric conversion apparatus according to claim 5, wherein
the semiconductor region of the corresponding floating diffusion region and the gate electrode of the amplifying transistor of each unit cell are electrically connected by a shared contact.

13. The photoelectric conversion apparatus according to claim 5, wherein
the semiconductor region of the corresponding floating diffusion region and the gate electrode of the amplifying transistor of each unit cell are electrically connected by a conductor.

14. The photoelectric conversion apparatus according to claim 5, wherein
the light shielding portion of each of the unit cells is not electrically connected to a drain of the corresponding amplifying transistor.

15. The photoelectric conversion apparatus according to claim 1, further comprising second light shielding portions arranged above the light shielding portions of the plurality of unit cells.

16. A photoelectric conversion apparatus comprising:
a plurality of unit cells arranged, wherein each of the unit cells includes
a photoelectric conversion element,
a transfer transistor for transferring an electric charge generated in the photoelectric conversion element, and
a floating diffusion region including a semiconductor region into which the electric charge is transferred by the transfer transistor, wherein
each of the unit cells has a light shielding portion arranged above the floating diffusion region, the light shielding portion being formed of a conductive material,
each of the light shielding portions of the plurality of unit cells is separated from one another,
each of the light shielding portions is not electrically fixed, and
each of the light shielding portions is not electrically connected to the floating diffusion region.

* * * * *